US008067098B2

(12) United States Patent
Helmick et al.

(10) Patent No.: US 8,067,098 B2
(45) Date of Patent: Nov. 29, 2011

(54) SULFIDATION-RESISTANT COATING SYSTEM

(75) Inventors: David A. Helmick, Fountain Inn, SC (US); Yuk-Chiu Lau, Ballston Lake, NY (US); David Vincent Bucci, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 55 days.

(21) Appl. No.: 12/411,801

(22) Filed: Mar. 26, 2009

(65) Prior Publication Data

US 2010/0247927 A1 Sep. 30, 2010

(51) Int. Cl.
*B32B 15/00* (2006.01)
*B32B 15/04* (2006.01)
*F23D 11/00* (2006.01)
*F23D 11/38* (2006.01)

(52) U.S. Cl. ........ 428/639; 428/663; 428/332; 428/678; 428/680; 431/159

(58) Field of Classification Search .................. 428/627, 428/632, 633, 642, 662, 663, 664, 332, 639, 428/472, 704, 678, 680
See application file for complete search history.

(56) References Cited

U.S. PATENT DOCUMENTS

| 5,368,813 | A | * | 11/1994 | Hobbs et al. ............ 420/425 |
| 5,484,665 | A | * | 1/1996 | Singh et al. ............ 428/661 |
| 5,569,475 | A | * | 10/1996 | Adas et al. ............ 425/549 |
| 5,643,474 | A | * | 7/1997 | Sangeeta ............ 216/96 |
| 7,416,404 | B2 | | 8/2008 | Chan |
| 2003/0186075 | A1 | * | 10/2003 | Zhao et al. ............ 428/670 |
| 2010/0055339 | A1 | * | 3/2010 | Shinde et al. ............ 427/451 |

FOREIGN PATENT DOCUMENTS

WO    WO 2004/048632    *    6/2004

OTHER PUBLICATIONS

Molybdenum TZM Material Safety Data Sheet, Electronic Space Products International (Aug. 2002) (3 pages) (downloaded from www.espi-metals.com on Jul. 14, 2010).*
Chevron, "Aviation Fuels Technical Review," 2006 (no month), pp. 1-96, downloaded from www.experimentalaircraft.info on Mar. 16, 2011.*

* cited by examiner

*Primary Examiner* — Michael Lavilla
(74) *Attorney, Agent, or Firm* — Ernest G. Cusick; Gary M. Hartman; Domenica N. S. Hartman

(57) ABSTRACT

A coating system and process for protecting component surfaces exposed to sulfur-containing environments at elevated temperatures. The coating system includes a sulfidation-resistant overlay coating that is predominantly niobium or molybdenum.

5 Claims, 2 Drawing Sheets

SULFIDATION-RESISTANT COATING SYSTEM

BACKGROUND OF THE INVENTION

This invention generally relates to protective coatings for components exposed to high temperatures. More particularly, this invention is directed to a coating system that provides sulfidation protection at elevated temperatures within a sulfur-containing environment, such as the hostile thermal environment of a gasification system used in gas turbine power generation plants.

Power generation plants exist that burn coal to produce coal gas or synthesis gas (SNG), which is then combusted in a gas turbine. The output of the gas turbine may be used directly to power an electric generator. In combined cycle gas turbine plants, the hot exhaust gases of the turbine are used to generate steam for powering a steam turbine. The production of coal gas occurs in what is commonly termed a gasifier.

The components of a coal gasifier, including injectors and nozzles, are subjected to a thermally and chemically hostile environment. For this reason, coal gasifier components may be coated with protective coatings. Common examples include oxidation-resistant coatings and thermal barrier coatings (TBCs). A particular example is a thermal barrier coating system comprising a ceramic coating bonded to the component surface with an oxidation-resistant metallic bond coat. Various ceramic materials have been used and proposed as TBCs, the most widely used being zirconia ($ZrO_2$) partially or fully stabilized by yttria ($Y_2O_3$), magnesia (MgO), or ceria ($CeO_2$). TBCs can be deposited by a variety of processes, including plasma spraying, flame spraying, and physical vapor deposition (PVD) techniques. The bond coat serves to promote adhesion of the TBC to the component. Common examples of bond coat materials include aluminum-rich compositions, for example, diffusion coatings such as diffusion aluminides and diffusion platinum aluminides, and overlay coatings of an MCrAlX alloy where M is typically iron, cobalt and/or nickel, and X is yttrium, rare earth elements, and/or reactive elements. These bond coat materials develop an aluminum oxide (alumina) scale as a result of oxidation, such as during deposition of the TBC on the bond coat as well as at high temperatures in an oxidizing environment. The alumina scale chemically bonds the TBC to the bond coat and provides environmental protection to the bond coat and underlying substrate.

While effective for providing oxidation resistance, traditional bond coat materials are not effective for protecting components from sulfidation in the high-temperature sulfur-rich environment of a coal gasifier.

BRIEF DESCRIPTION OF THE INVENTION

The present invention provides a coating system suitable for components exposed to high temperatures, and particularly a sulfidation-resistant overlay coating capable of protecting a component surface when exposed to a sulfur-containing environment at elevated temperatures. Notable nonlimiting examples include the components of gasification systems used in gas turbine power generation plants.

According to a first aspect of the invention, the coating system lies on a surface region of a component subjected to sulfur and/or sulfur compounds at an elevated temperature, and the coating system comprises a sulfidation-resistant overlay coating that is predominantly niobium or molybdenum.

According to a second aspect of the invention, a process is provided by which a coating system is deposited on a surface region of a component adapted to be subjected to sulfur and/or sulfur compounds at an elevated temperature. The deposition step comprises depositing on the surface region a sulfidation-resistant overlay coating that is predominantly niobium or molybdenum.

The overlay coating of the coating system preferably contains a sufficient amount of niobium or molybdenum to grow an adherent niobium sulfide or molybdenum sulfide layer capable of inhibiting further sulfidation of the overlay coating and the underlying surface region of the component. In this manner, the overlay coating is useful for protecting gasifier components, as well as other components exposed to a sulfur-containing environment at elevated temperatures. The sulfide layer is also preferably slow growing and capable of promoting the spallation resistance and life of an optional coating deposited on the overlay coating.

Other aspects and advantages of this invention will be better appreciated from the following detailed description.

DETAILED DESCRIPTION OF THE INVENTION

Figure 1:
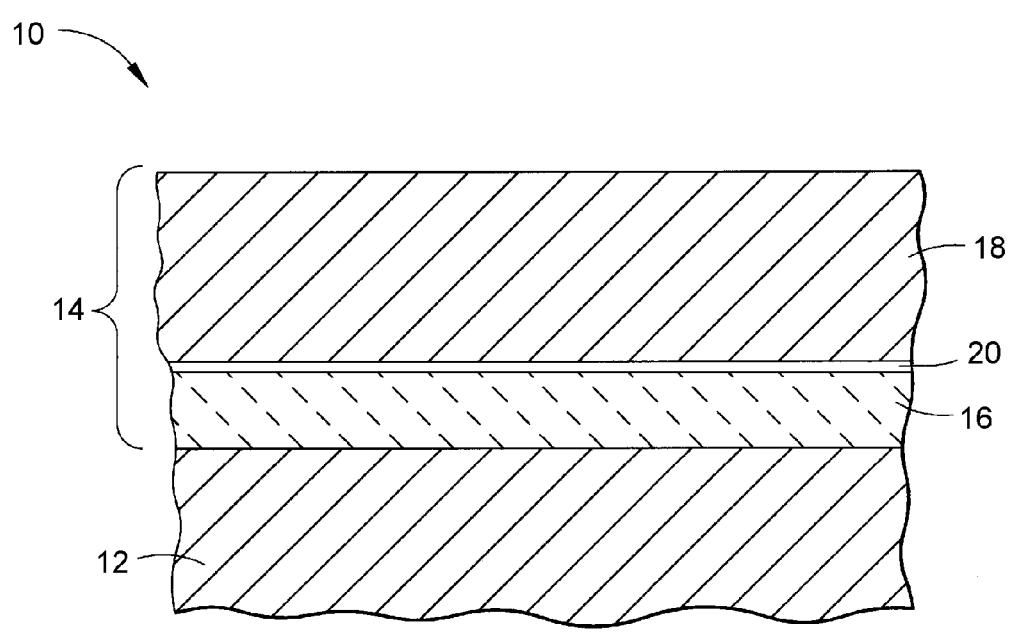
FIG. 1 schematically represents a cross-sectional view of a gasification component and a thermal barrier coating system on the component in accordance with an embodiment of the invention.

While the present invention is applicable to a variety of components, and especially those exposed to sulfur and sulfur compounds at high temperatures, the invention will be discussed in particular reference to components of coal gasification systems used in gas turbine power generation plants. A surface region 12 of one such component 10 is schematically represented in FIG. 1. The surface region 12 defines a portion of the component 10 contacted by gases containing sulfur or its compounds at elevated temperatures and which is therefore subjected to sulfidation. Depending on the particular application, the surface region 12 may also be subject to attack by oxidation and corrosion. The component 10 and its surface region 12 can be formed of a variety of materials, nonlimiting examples of which include nickel and cobalt-based superalloys. The invention is believed to be especially advantageous for use on nickel-based superalloys, which are particularly prone to sulfidation attack. An example of such an alloy is INCONELL™ alloy X-750, having a nominal composition of, by weight, about 15.5% Cr, 7.0% Fe, 2.5% Ti, 1.0% Nb, 0.7% Al, the balance Ni.

The surface region 12 represented in FIG. 1 is protected by a coating system 14 in accordance with an embodiment of the present invention. As shown, the coating system 14 includes a bond coat 16 overlying and directly contacting the surface region 12. The bond coat 16 is shown as adhering a thermal-insulating ceramic layer 18, or TBC, to the surface region 12. The ceramic layer 18 may have a dense vertically cracked (DVC) microstructure produced by plasma spraying or high velocity oxy-fuel (HVOF) spraying a liquid precursor or by an air plasma spraying process, for example, as disclosed in U.S. Pat. Nos. 5,830,586, 5,897,921, 5,989,343 and 6,047,539. Alternatively, the ceramic layer 18 may be produced to have a noncolumnar structure, as is commonly produced by conventional plasma spray techniques. The ceramic layer 18 could also be formed to have a strain-tolerant structure with columnar grains produced by depositing the ceramic layer 18 using a physical vapor deposition technique known in the art, for example, electron beam-physical vapor deposition (EB-PVD). A particularly suitable material for the ceramic layer 18 is believed to be an yttria-stabilized zirconia (YSZ), a preferred composition being about 6 to about 8 weight percent yttria (6-8% YSZ), optionally with additional oxides to reduce thermal conductivity. Other ceramic materials could be used for the ceramic layer 18, such as yttria, nonstabilized zirconia, or zirconia stabilized by magnesia, ceria, scandia, and/or other oxides. The ceramic layer 18 can be deposited to a thickness that is sufficient to provide a desirable level of thermal protection for the underlying surface region 12 and component 10, typically on the order of about 75 to about 300 micrometers, though lesser and greater thicknesses are also possible.

While shown and described in reference to a coating system 14 that includes a ceramic layer 18, the present invention is also applicable to coating systems that do not include a ceramic coating or any other overlying coating layer. In the absence of an overlying coating layer, the bond coat 16 serves as an environmental coating that defines the outermost layer of the coating system 14 and the outermost surface of the component 10.

The bond coat 16 is represented in FIG. 1 as an overlay coating, as opposed to a diffusion coating. Various deposition processes can be used to deposit the overlay bond coat 16, including cold spraying (kinetic metallization), HVAF (high velocity air-fuel), HVOF (high velocity oxy-fuel), plasma spraying (air, vacuum, etc.), cathodic arc deposition (also called ion plasma deposition (IPD)), EB-PVD, and cored-wire arc spray. As an overlay coating, the bond coat 16 forms a limited diffusion zone in the surface of the surface region 12, though over time at elevated temperatures some level of interdiffusion will occur between the bond coat 16 and the surface region 12 as a result of diffusional gradients and changes in elemental solubility in the local region of the surface region 12.

According to a particular aspect of the invention, the bond coat 16 has a niobium-based or molybdenum-based metallic composition. The metallic composition may be entirely niobium or molybdenum with typical impurities, or may be alloyed, blended, or clad with, for example, chromium, aluminum, cobalt, yttrium, silicon, boron, hafnium, iron, etc. Niobium or molybdenum is the preferred predominant constituent of the bond coat 16 (the composition contains more niobium or molybdenum than any other individual constituent) so as to be capable of forming a passivating sulfide layer 20 (niobium disulfide ($NbS_2$) or molybdenum disulfide ($MOS_2$)) on the surface of the bond coat 16 that inhibits further sulfidation of the bond coat 16 and protects the underlying surface region 12 of the component 10 from sulfidation. Advantageously, the sulfide layer 20 is also adherent and slow growing, and therefore is capable of promoting the spallation resistance and life of the ceramic layer 18 or another overlying coating layer that might be present on the bond coat 16.

For niobium-based metallic compositions for the bond coat 16, a minimum niobium content is believed to be about 25 weight percent to ensure sufficient sulfide formation, while the maximum niobium content can be 100 weight percent. A suitable niobium content is in a range of about 50 to about 100 weight percent of the bond coat composition, and a particularly preferred niobium content is believed to be about 50 to about 100 weight percent.

For molybdenum-based metallic compositions for the bond coat 16, a minimum molybdenum content is believed to be about 20 weight percent to ensure sufficient sulfide formation, while the maximum molybdenum content can be 100 weight percent. A suitable molybdenum content is in a range of about 35 to about 100 weight percent of the bond coat composition, and a particularly preferred molybdenum content is believed to be about 40 to about 100 weight percent.

Suitable constituents that can be alloyed, blended, or clad with niobium or molybdenum to form the niobium- or molybdenum-based bond coat 16 can vary depending on the particular application, including the composition of the surface region 12, the composition of the ceramic layer 18 (if present), and the environmental conditions to which the bond coat 16 is exposed. With the exception of nickel, suitable constituents are believed to include typical MCrAlX constituents, for example, cobalt, iron, chromium, aluminum and yttrium. Other potential constituents that may be used with or instead of MCrAlX constituents include silicon, boron, hafnium, and chromium carbides (CrC and/or $Cr_3C_2$). The presence of oxide formers such as chromium, aluminum, yttrium, silicon, hafnium, etc., can be advantageous if the bond coat 16 will be exposed to an oxidizing environment. Alloying with aluminum, silicon, boron, etc., can be desirable to promote the ductility of the bond coat 16. The bond coat 16 is preferably free of nickel in view of the susceptibility of nickel to sulfidation, though the bond coat 16 may contain nickel as an impurity, preferably accounting for less than one weight percent of the bond coat composition.

It is foreseeable that the bond coat 16 may be used in combination with a diffusion barrier between the surface region 12 and bond coat 16 to inhibit interdiffusion. Alternatively or in addition, interdiffusion between the bond coat 16 and surface region 12 can be inhibited by forming the bond coat 16 to be a blend of niobium or molybdenum with one of the above-noted MCrAlX bond coat compositions, for example, CoCrAlY or FeCrAlY.

The bond coat 16 is believed to be particularly effective when deposited to a thickness of at least about 100 micrometers. A maximum thickness is believed to be about 500 micrometers, though it is foreseeable that a bond coat 16 of greater could be used. A particularly suitable thickness range is believed to be on the order of about 150 to about 400 micrometers. Following deposition, the bond coat 16 may undergo a heat treatment, for example, at a temperature of about 1800° F. to about 2000° F. (about 980° C. to about 1090° C.) and for a duration of about two to about four hours, to relieve any stresses induced by the coating process.

Figure 2:
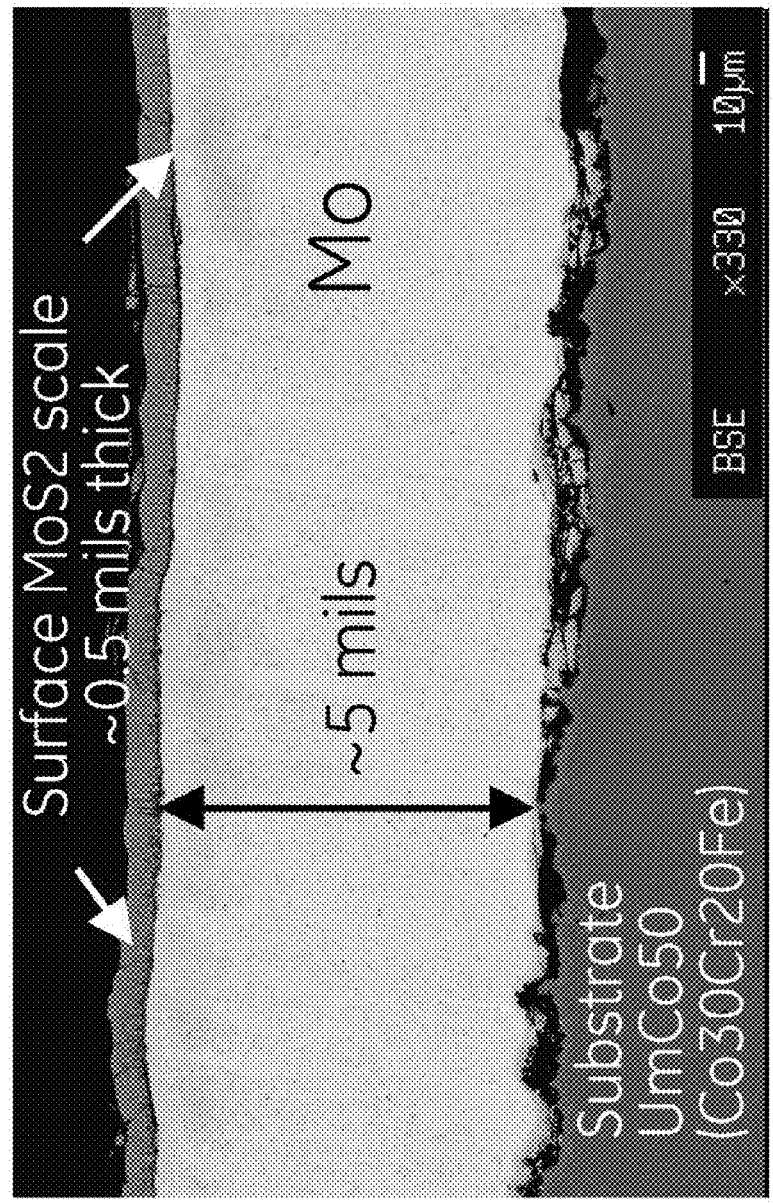
FIG. 2 is a scanned image of a cross-section of a substrate protected by a molybdenum coating following an extended high-temperature exposure to a syngas.

In an investigation leading to this invention, molybdenum coatings were deposited as environmental coatings (in other words, without a thermal barrier coating) on coupons formed of a cobalt-based alloy containing, by weight, about 30% chromium, about 20% iron, and the balance essentially cobalt. The molybdenum coatings were deposited by ion plasma deposition (IPD) to have thicknesses of about 0.002 to about 0.005 inch (about 50 to about 125 micrometers, and subjected to a syngas at a temperature of about 1400° F. (about 760° C.) at a pressure of about 35 psi (about 2.4 bar). The composition of the syngas was, by volume, about 2% hydrogen sulfide ($H_2S$), about 10% carbon dioxide ($CO_2$), about 40% carbon monoxide (CO), and the balance hydrogen ($H_2$). FIG. 2 shows the appearance of one of the molybdenum coatings following an exposure duration of about 1800 hours, and evidences the growth of an adherent scale that was found to be almost entirely sulfur, oxygen, carbon, and molybdenum. The molybdenum and sulfur contents were indicative of molybdenum sulfide present in the scale. A thin interaction zone visible beneath the molybdenum coating was found to contain chromium, iron and cobalt from the substrate, molybdenum from the coating, a very low amount of oxygen, and no detectable amounts of sulfur, evidencing that the molybdenum coating successfully protected the substrate from sulfidation as well as provided a significant barrier to oxidation.

While the invention has been described in terms of a preferred embodiment, it is apparent that other forms could be adopted by one skilled in the art. Accordingly, the scope of the invention is to be limited only by the following claims.

The invention claimed is:

1. A coating system on a metallic surface region of a coal gasifier component that is formed of a nickel-based or cobalt-based superalloy, the component being installed in an operating coal gasifier and contacting a coal gas or syngas that contains sulfur and/or sulfur compounds at an elevated temperature, the coating system comprising a sulfidation-resistant overlay coating on and contacting the surface region and an adherent molybdenum sulfide layer on an outermost surface of the overlay coating, the overlay coating consisting of molybdenum and impurities, and the molybdenum sulfide layer inhibiting sulfidation of the overlay coating and the metallic surface region.

2. The coating system according to claim 1, wherein the overlay coating is a bond coat, the coating system further comprising a ceramic coating overlaying said adherent molybdenum sulfide layer and said ceramic coating having a thickness of at least 75 micrometers.

3. The coating system according to claim 1, wherein the surface region comprises a metallic diffusion barrier that inhibits interdiffusion between the overlay coating and the surface region.

4. The coating system according to claim 1, wherein the overlay coating has a thickness of at least 100 micrometers.

5. The coating system according to claim claim 1, wherein the component is a gasifier nozzle.

* * * * *